US007033514B2

(12) United States Patent
Rueger

(10) Patent No.: US 7,033,514 B2
(45) Date of Patent: Apr. 25, 2006

(54) METHOD AND APPARATUS FOR MICROMACHINING USING A MAGNETIC FIELD AND PLASMA ETCHING

(75) Inventor: Neal Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 09/938,644

(22) Filed: Aug. 27, 2001

(65) Prior Publication Data

US 2003/0040178 A1 Feb. 27, 2003

(51) Int. Cl.
*H01L 21/302* (2006.01)

(52) U.S. Cl. ........................ 216/2; 11/59; 11/67; 11/70; 438/710; 438/715; 438/723; 438/724; 438/732; 216/11; 216/59; 216/67; 216/70; 977/DIG. 1

(58) Field of Classification Search .................... 216/2, 216/11, 59, 67, 70; 438/710, 714, 723, 724, 438/732

See application file for complete search history.

(56) References Cited

U.S. PATENT DOCUMENTS 4,668,338 A * 5/1987 Maydan et al. ............. 438/732
4,729,815 A * 3/1988 Leung ........................ 438/714
5,079,481 A * 1/1992 Moslehi ................. 315/111.41
5,441,595 A * 8/1995 Yamagata et al. .......... 438/701
5,534,108 A * 7/1996 Qian et al. .................. 438/732
5,662,819 A * 9/1997 Kadomura ................... 216/70
5,932,488 A * 8/1999 Takizawa et al. ........... 438/714
5,972,193 A 10/1999 Chou et al.
5,976,347 A 11/1999 Wakabayashi et al.
6,015,476 A * 1/2000 Schlueter et al. ...... 204/298.37
6,020,268 A * 2/2000 Cheng ........................ 438/714
6,103,399 A 8/2000 Smela et al.
6,194,680 B1 * 2/2001 Watanabe et al. ...... 219/121.41
6,392,187 B1 * 5/2002 Johnson ....................... 216/55
6,451,703 B1 * 9/2002 Liu et al. .................... 438/710
6,767,838 B1 * 7/2004 Ono et al. .................. 438/720

FOREIGN PATENT DOCUMENTS

JP 63153289 A * 6/1988
JP 01030224 A * 2/1989
JP 01270229 A * 10/1989
JP 03253585 A * 11/1991
JP 03278529 A * 12/1991
JP 04199711 A * 7/1992
JP 06291085 A * 10/1994
WO WO 9532315 A1 * 11/1995

OTHER PUBLICATIONS

Method of Increasing the Deposition and Etch Rates in Plasma Processes, IBM Technical Disclosure Bulletin, vol. 25, No. 7A, Dec. 1982, p. 3161.*

(Continued)

*Primary Examiner*—Anita Alanko
(74) *Attorney, Agent, or Firm*—Dickstein Shapiro Morin & Oshinsky LLP

(57) ABSTRACT

This invention relates to a method and apparatus for forming a micromachined device, where a workpiece is plasma etched to define a microstructure. The plasma etching is conducted in the presence of a magnetic field, which can be generated and manipulated by an electric field. The magnetic field effects the electrons present in the plasma by directing them to "collect" on a desired plane or surface of the workpiece. The electrons attract the ions of the plasma to etch the desired region of the a workpiece to a greater extent than other regions of the workpiece, thereby enabling the formation of more precise "cuts" in the workpiece to form specific shapes of microstructures. The magnetic field can be controlled in direction and intensity and substrate bias power can also be controlled during etching to precisely and accurately etch the workpiece.

66 Claims, 14 Drawing Sheets

OTHER PUBLICATIONS

Marc Schaepkens et al.; "Asymmetric microtrenching during inductively coupled plasma oxide etching n the presence of a weak magnetic field", Applied Physics Letters, vol. 72, No. 11, Mar. 16, 1998, pp 1293–1295.

K. Donohoe; "Aspect Ratio–Plasma Effects" Mar. 14, 2000.

"Introduction to Microengineering, Mask Design", http://www.dbanks.demon.co.uk/ueng/maskdes.html_accessed Jul. 3, 2001.

"Introduction to Microengineering, LIGA", http://www.dbanks.demon.co.uk/ueng/liga.html accessed Jul. 3, 2001.

"Introduction to Microengineering, Excimer laser micromachining", http://www.dbanks.demon.co.uk/ueng/excimerum.html accessed Jul. 3, 2001.

"Introduction to Microengineering, Wafer bonding", http://www.dbanks.demon.co.uk/ueng/waferbond.html accessed Jul. 3, 2001.

"Introduction to Microengineering, Electrochemical etching of silicon", http://www.dbanks.demon.co.uk/ueng/electrochem.html accessed Jul. 3, 2001.

"Introduction to Microengineering, Surface micromachining", http://www.dbanks.demon.co.uk/ueng/surfum.html accessed Jul. 3, 2001.

"Introduction to Microengineering, Basic Structures", http://www.dbanks.demon.co.uk/ueng/sistruct.html accessed Jul. 3, 2001.

"Introduction to Microengineering, Lift off", http://www.dbanks.demon.co.uk/ueng/liftoff.html accessed Jul. 3, 2001.

"Introduction to Microengineering, Dry Etching", http://www.dbanks.demon.co.uk/ueng/dryetch.html accessed Jul. 3, 2001.

"Introduction to Microengineering, Wet etching", http://www.dbanks.demon.co.uk/ueng/wetetch.html accessed Jul. 3, 2001.

"Introduction to Microengineering, Thin films", http://www.dbanks.demon.co.uk/ueng/Thinfilms.html accessed Jul. 3, 2001.

"Introduction to Microengineering, Basic techniques", http://www.dbanks.demon.co.uk/ueng/sitech.html accessed Jul. 3, 2001.

"Integrated MicroElectroMechanical Systems", http://www.mdl.sandia.gov/micromachine/integrated.html accessed Jul. 3, 2001.

"Summit Technology", http://www.mdl.sandia.gov/micromachine/trilevel.html accessed Jul. 3, 2001.

"MEMS Overview", http://www.mdl.sandia.gov/micromachine/overview.html accessed Jul. 3, 2001.

"Vision for MEMS", http://www.mdl.sandia.gov/micromachine/vision.html accessed Jul. 3, 2001.

Philip Ball; "Honey, I shrunk the cogs", http://www.nature.com/nsu/010111/010111–3.html Jul. 12, 2001.

"Optical Microrotors" http://www.physicstoday.org/pt/vol–54/iss–3/p9.html, accessed Jul. 12, 2001.

* cited by examiner

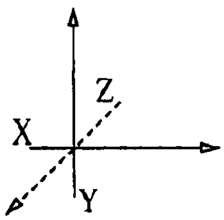
FIG. 9
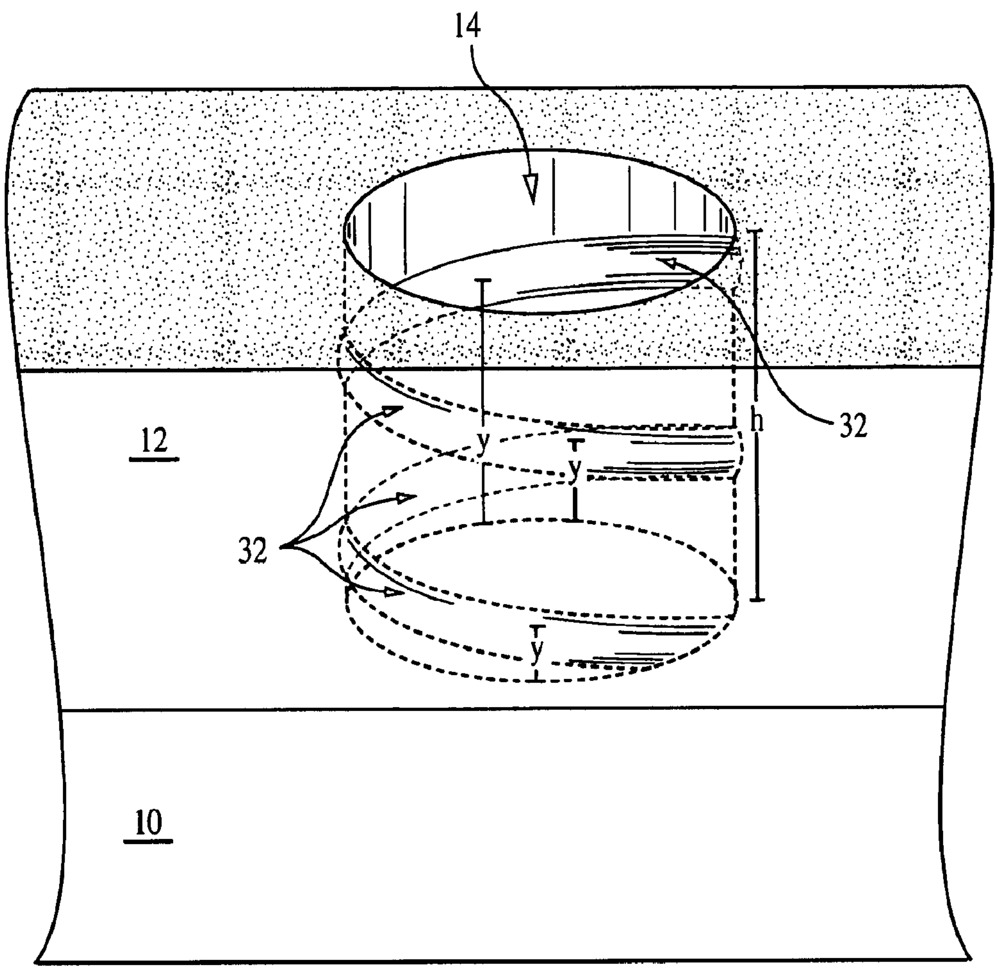

METHOD AND APPARATUS FOR MICROMACHINING USING A MAGNETIC FIELD AND PLASMA ETCHING

FIELD OF THE INVENTION

This invention relates to a method and apparatus for fabrication of micromachined structures.

BACKGROUND OF THE INVENTION

Micromachining allows the manufacturing of structures and machines so small that they are imperceptible with the human eye. Micromachined devices are commonly used as pumps, motors, accelerometers, pressure sensors, chemical sensors, valves, micro-motion systems, and grippers, and commonly have dimensions on the scale of nanometers to centimeters. Micromachined systems are know in the art as MicroElectroMechanical Systems, or MEMS. MEMS is a relatively new technology that exploits the existing microelectronics infrastructure to create complex machines with micron feature sizes.

An ideal material from which to make MEMS is polycrystalline silicon (polysilicon). Its mechanical properties are suitably strong, flexible, and does not readily fatigue. Additionally, polysilicon is directly compatible with modem integrated circuit fabrication processes. Often, MEMS are produced in batch fabrication, leading to large volumes and extremely low fabrication costs.

Micromachines can have no moving parts, bending parts, or completely free and movable parts. These types of devices have been formed by surface micromachining, bulk micromachining, and LIGA (meaning Lithographie, Galvanoformung, Abformung) (and variations thereof). Surface micromachining is accomplished by three basic techniques: deposition of thin films; wet chemical etching; and dry etching techniques. The most common form of dry etching for micromachining application is reactive ion etching (RIE). Ions are accelerated towards the material to be etched, and the etching reaction is enhanced in the direction of travel of the ion. RIE is an anisotropic etching technique. Trenches and pits many microns deep of arbitrary shape and with vertical sidewalls can be etched by prior art techniques in a variety of materials, including silicon, oxide, and nitride. RIE is not limited by the crystal planes of polysilicon.

Dry etching techniques can be combined with wet etching to form various micro devices. "V" shaped grooves or pits with tapered sidewalls can be formed in silicon by anisotropic etching with KOH etchant. Another etching technique, with roots in semiconductor processing, utilizes plasma etching.

Weak magnetic fields have been used to provide for asymmetric microtrenching using high-density fluorocarbon plasma etching techniques. As practiced in the art, a small magnet can be used at the center of a semiconductor wafer. The wafer would be previously patterned for the subsequent etching procedure. A 1600 nm thick oxide (BPSG) layer over a silicon wafer is patterned with a 900 nm thick resist mask. Prepared in this way, the wafer is etched for 150 seconds at a self-bias voltage of −125 volts (150 W RF bias power) at 3.4 MHz, to a depth of around 100 nm into the oxide layer. The thickness of the mask after etching is about 700 nm. By etching while the plasma is subjected to a magnetic field (−$10^2$G), where the magnetic field runs parallel to the wafer cross section, deeper etching is accomplished on one side of a trench than the other as directed by the magnetic field.

It would be advantageous if micromachine devices could be fabricated with increased delicacy and precision. More precise control of etching techniques to create increasingly complex shapes and forms for micromachine devices would be an advantage in the art. Greater control of etching techniques would lead to new types of devices, not available with less precise techniques.

BRIEF SUMMARY OF THE INVENTION

This invention relates to a method and apparatus for forming a micromachined device, where a workpiece is plasma etched to define a microstructure. The plasma etching is conducted in the presence of a magnetic field, which can be generated and manipulated. The magnetic field effects the electrons present in the plasma by directing them to "collect" on a desired plane or surface of the workpiece. The electrons attract the ions of the plasma to etch the desired region of the workpiece to a greater extent than other regions of the workpiece, thereby enabling the formation of more precise "cuts" in the workpiece to form specific shapes of microstructures. The magnetic field can be controlled in direction and intensity and substrate bias power can be controlled to precisely and accurately control the plasma etching.

BRIEF DESCRIPTION OF THE DRAWINGS

FIGS. 9 and 10 are illustrations of post-etching of a workpiece in accordance with an embodiment of the invention.

DETAILED DESCRIPTION OF THE INVENTION

Figure 1:
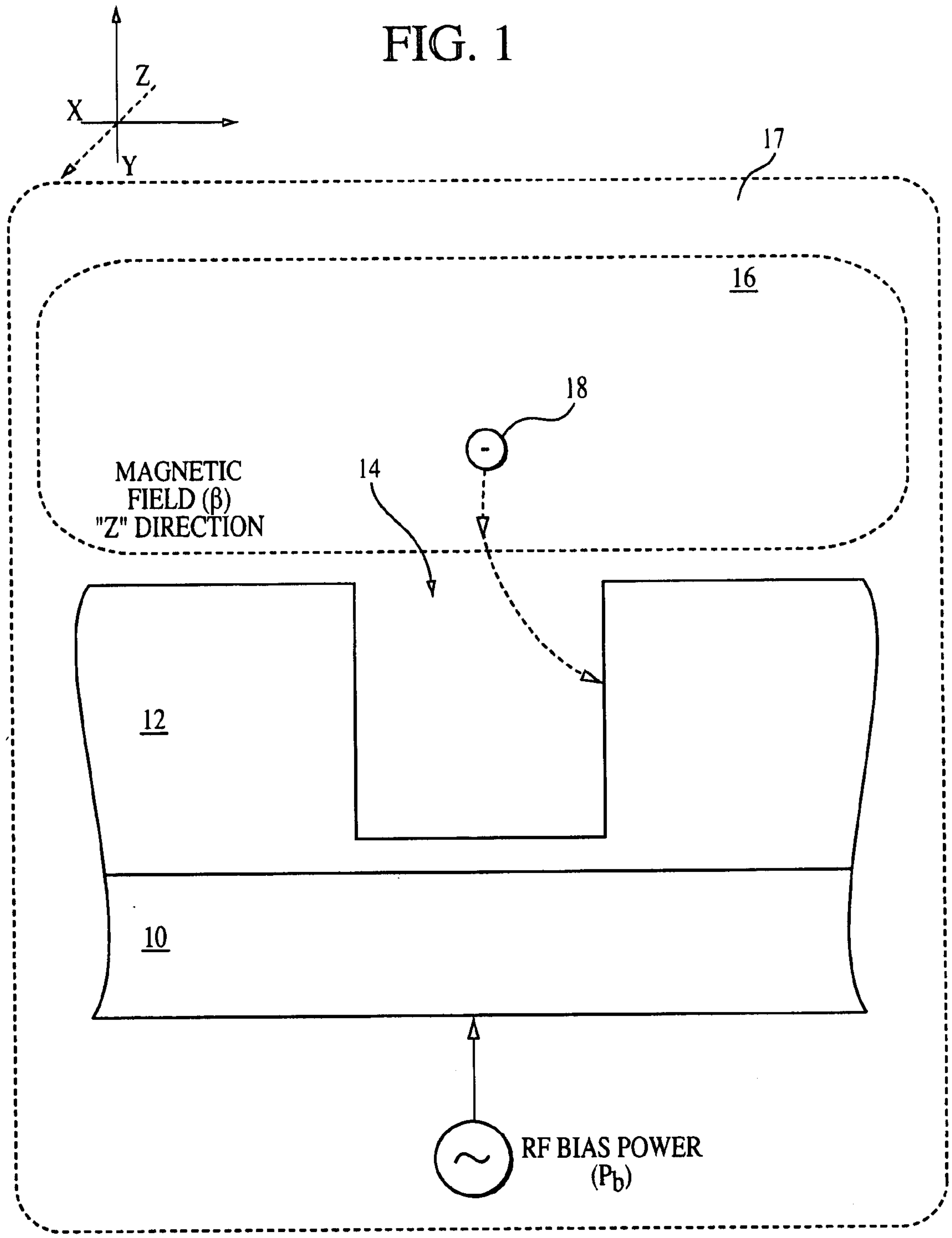
FIG. 1 is an illustrative representation of utilization of a magnetic field to direct the travel of a free electron of a plasma cloud, in accordance with the invention.

As used herein, the terms "wafer," "substrate," or "workpiece" are used interchangeably and are understood as including all substrates used in the art of micromachining, particularly including layers susceptible to sputtering or chemical sputtering. Such substrates include but are not limited to silicon, polycrystalline silicon (poly), oxides, or nitrides, or combinations thereof; such materials should be reasonably good insulators. Furthermore, references to a "wafer," "substrate," or "workpiece" in the following description do not exclude previous processing steps utilized to form regions or layers upon the base structure or foundation.

No particular order is required for the method steps described below, with the exception of those logically requiring the results of prior steps. Accordingly, while many of the steps discussed are explained as being performed in an exemplary order, this order may be altered.

The invention relates to a method and apparatus for forming a micromachined device, where a workpiece is plasma-etched to define a microstructure. The plasma etching is conducted in the presence of a magnetic field, which can be generated and manipulated. The magnetic field effects the free electrons present in the plasma by directing them to "collect" on a desired plane or surface of the workpiece. The electrons attract the ions of the plasma to etch the desired region of the workpiece to a greater extent than other regions of the workpiece, thereby enabling the formation of more precise "cuts" in the workpiece to form specific shapes of microstructures. The magnetic field can be controlled in direction and intensity, along with similar control of the biasing power, to precisely and accurately control the plasma etching.

The magnetic field serves to create an electron differential at a region of the workpiece. Because of this differential, one side of a feature on the landscape of the workpiece, be it a trench, a hole, or a feature in relief, is at a higher electrical potential than another side of the feature or an adjacent empty space. In such a scenario, the ions of the plasma will be deflected ("steered") towards the region that has the higher electron density. This region is the HNCD region, meaning High Negative Charge Density. An accompanying region of Low Negative Charge Density, the LNCD region, may be paired with the HNCD to create an electric field differential. The velocity of the ions of the plasma can be manipulated by controlling the biasing of the substrate, which, in cooperation with the negative intensity of the HNCD, will effect where on the workpiece ions impact to etch. The magnetic field used to control the electrons, however, is not great enough to directly effect the path of the ions.

The micromachining of materials is achieved by ion steering. The ion bombardment can result in either physical sputtering in the case of inert species, or chemical sputtering in the case of reactive species. The ion steering mechanism is complex and requires some explanation. It can be affected by bulk plasma properties such as perturbations in inductive power, gas flows, chamber pressure, etc. However, for this procedure to work consistently, the bulk properties should be stable and any perturbations be kept to an acceptable level.

For many plasma systems, bulk plasma conditions can be maintained at levels of stability that are sufficient for this invention. It is not intended that this exclude any bulk plasma parameter from being manipulated to affect ion steering, for this is indeed a possibility. The plasma parameters in accordance with the invention can vary and will be influenced to a large extent by the type of reactor used. For High Density Plasmas of the inductively coupled type, pressures between about 1 mTorr and about 40 mTorr are typical, with gas flows from about 50 sccm to about 500 sccm. Gas types can be selected from a wide variety depending on the application. For physical sputtering any of the inert (noble) gases could be used (He, Ne, Ar, Xe, and Kr), while if chemical sputtering, $Ch_xF_y$ (Fluorocarbons), $O_2$, $CCL_x$, and many others can be used.

An example of one embodiment of the invention is as follows; however, the invention is not limited to such. The steps of the process of the invention will typically take place in a standard processing chamber. Now referring to FIG. 1, a high density plasma 16 is generated in a plasma reactor 17 under stable bulk plasma conditions. A magnetic field is generated (e.g., by movable magnets or electric coils) and is manipulated in intensity and direction. Methods for generating and manipulating the magnetic field will be discussed below.

The workpiece comprises a silicon substrate layer 10 with an overlying etchable layer 12, which can be silicon oxide, but is not limited to such. The etchable layer 12 should be an insulating material in order for charge anisotropy to be maintained. Generally, silicon oxides or silicon nitrides are good examples of insulators having the requisite characteristics; however, many other materials would work for the invention. There should be some contour to the surface of the workpiece, be it an extruding structure in relief, or a trench 14 (or hole) in the etchable layer 12, as shown. It is on the surfaces of the contour that a HNCD 22 (see FIG. 2) can be established.

The workpiece is biased in order to achieve anisotropic ion bombardment in a controllable and manipulatable way. Typically, RF bias powers ($P_b$) which is variable between about 0 watts and about 5000 watts are used. Inductive powers of between about 300 watts and about 10,000 watts are also typical. A relatively weak magnetic field (about $10^2$ G) is generated in the "Z" direction, as referring to FIG. 1, in the presence of the plasma 16. The generated plasma 16 contains free electrons 18, which are subject to the magnetic field. In a magnetic field in the "Z" direction, as in FIG. 1, a force is exerted on the free electrons 18 so that the free electrons 18 with a velocity component in the negative "Y" direction are deflected perpendicularly in the "X" direction. In this way, an anisotropic charge distribution within the trench 14 can be achieved so that a HNCD region 22, as shown in FIG. 2, is formed.

Figure 2:
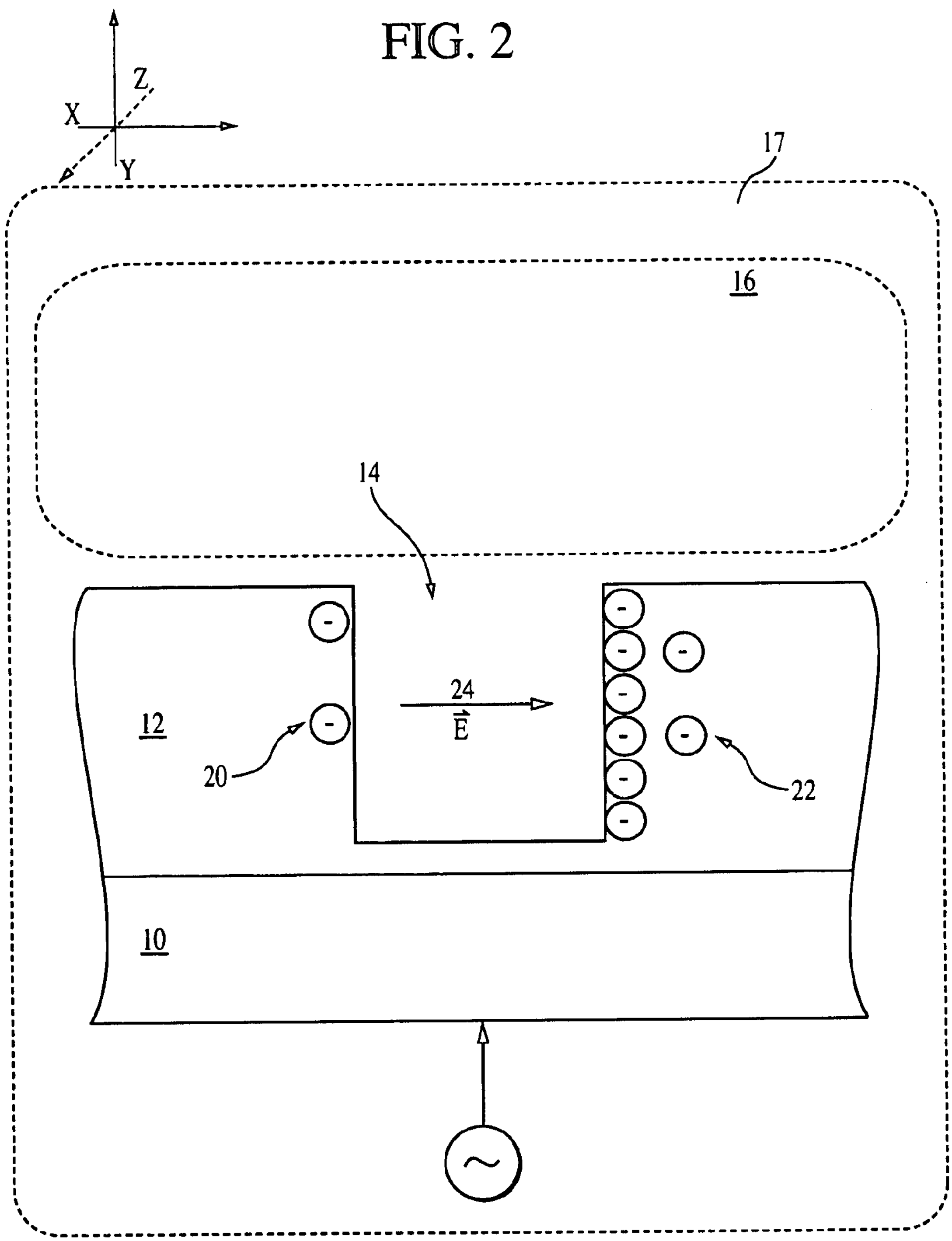
FIG. 2 is an illustration of the creation of LNCD and HNCD to establish a localized electric field in accordance with the invention.

Now referring to FIG. 2, when a trench 14 is utilized, as is in this embodiment, a HNCD region 22 and a LNCD region 20 are formed within the trench 14. This creates a resulting localized electric field ($\vec{E}$), 24 within the trench. The right side of the trench 14 shown is more negative than the left side. Due to the difference in charging, the electric field 24 created is sufficiently strong to cause ion 26 deflection within this space, as shown in FIG. 3.

Figure 3:
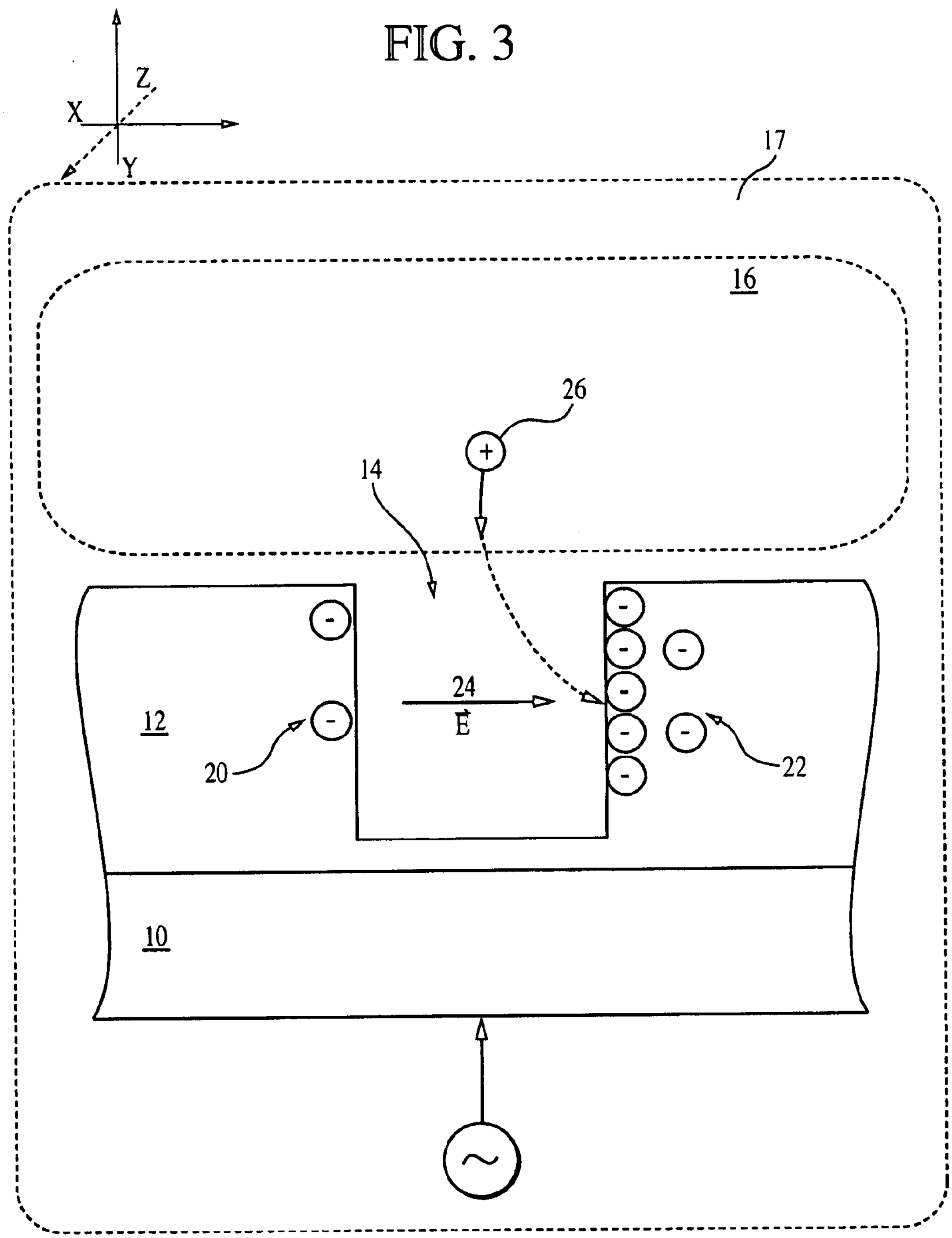
FIG. 3 is an illustrative representation of ion steering in accordance with the invention.

Now referring to FIG. 3, the fact that introduction of a weak magnetic field adjacent the trench 14 structure results in a charge anisotropy within the structure, which establishes a strong electric field ($\vec{E}$) 24, enables one to use RF bias as a controlling factor for accelerating ions 26 of the plasma 16 toward the substrate. These ions 26 will experience an electric force due to the presence of the electric field 24 and will be deflected in the direction of the electric field 24 vector. By variations in the magnetic field intensity ($\vec{\beta}$) and the biasing power ($P_b$), ion "steering" can be achieved. This is because the electric field 24 intensity (|E|) is directly affected by the magnetic field intensity ($|\vec{\beta}|$), and the electric field direction (|E|) is perpendicular to the magnetic field direction ($\vec{\beta}/|\vec{\beta}|$), while the ion velocity (in the "Y" direction) is controlled by the RF bias power ($P_b$).

Figure 4:
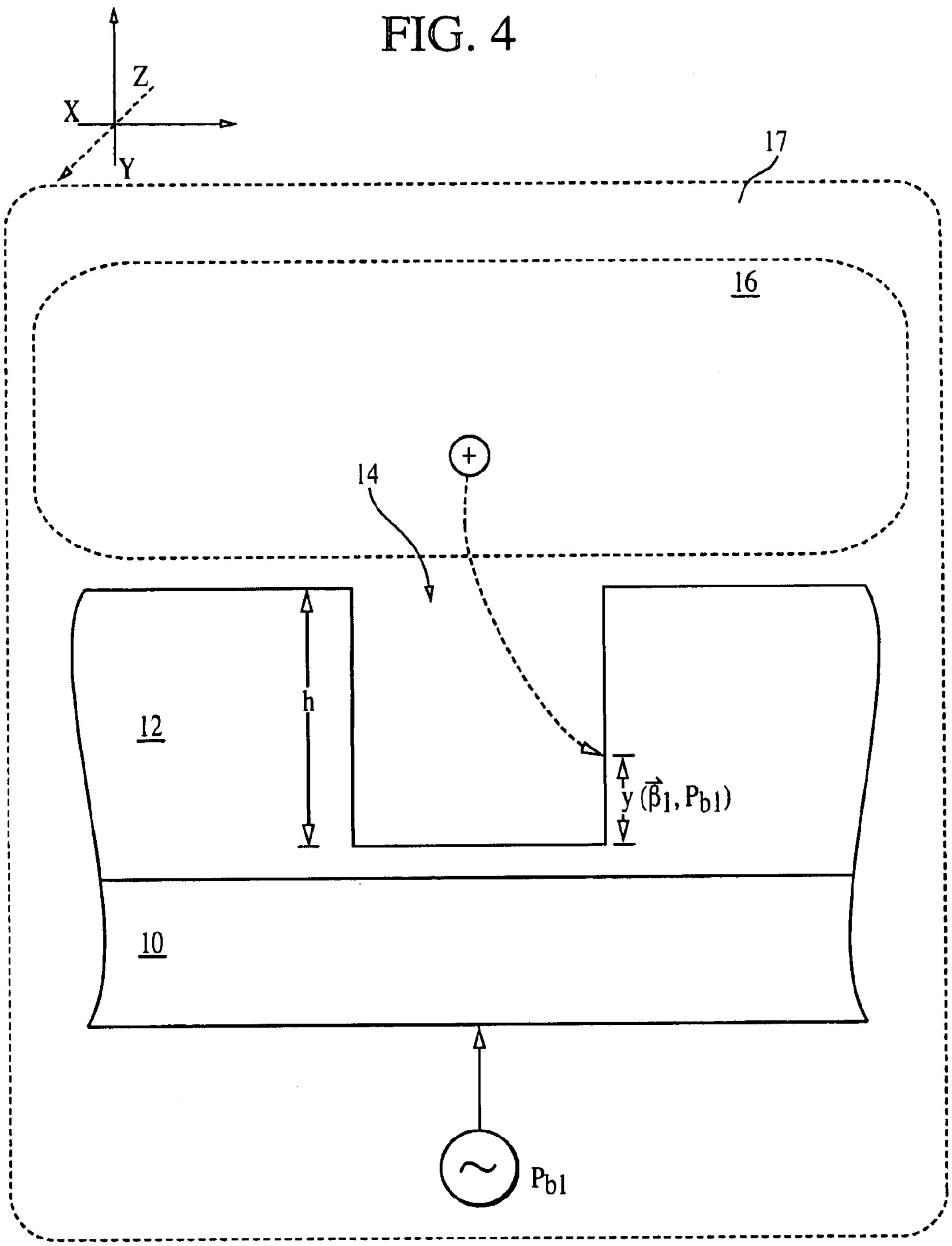
FIGS. 4–6 are illustrations demonstrating control of ion steering by manipulation of plasma etching and magnetic field parameters in accordance with the invention.
Figure 5:
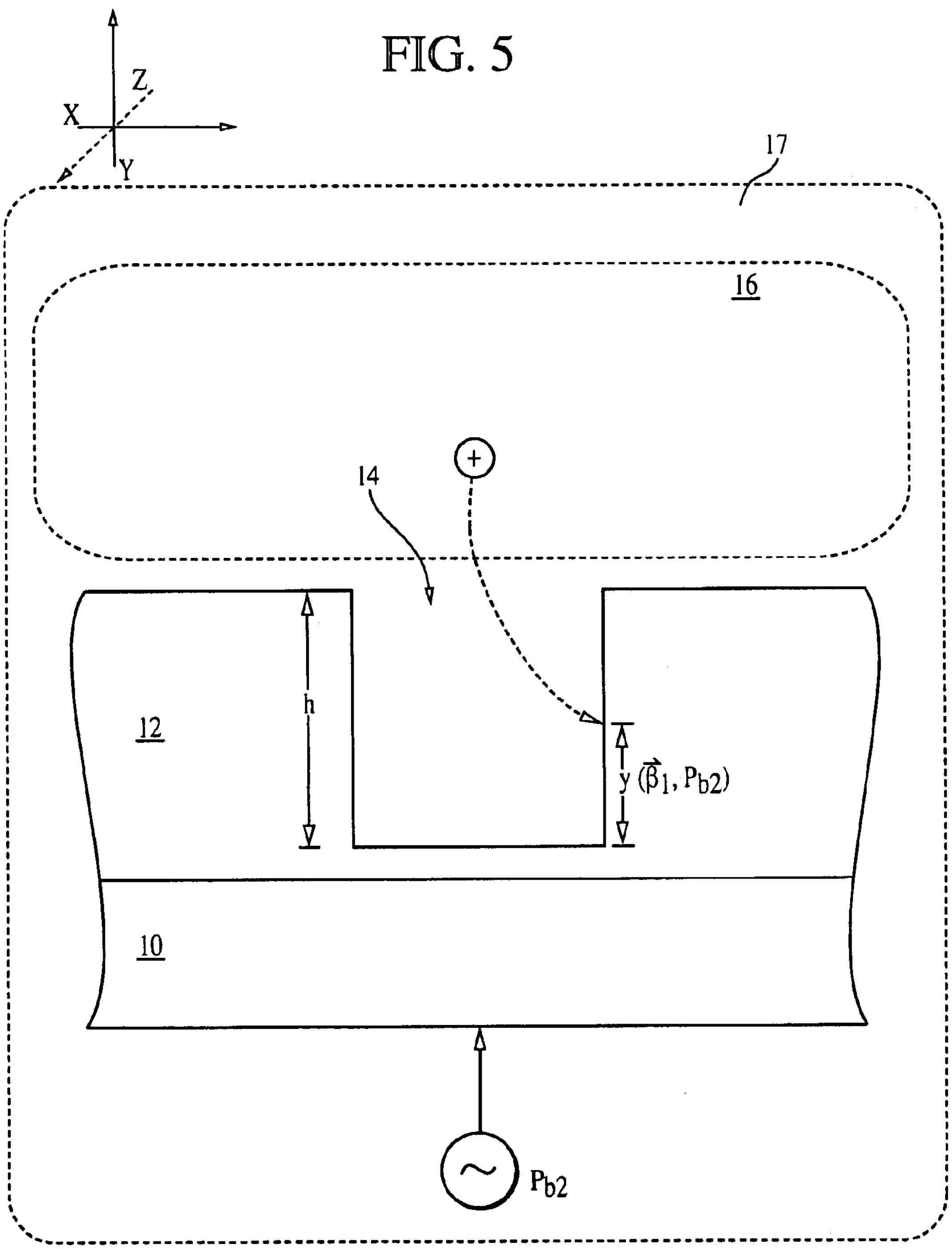
Figure 6:
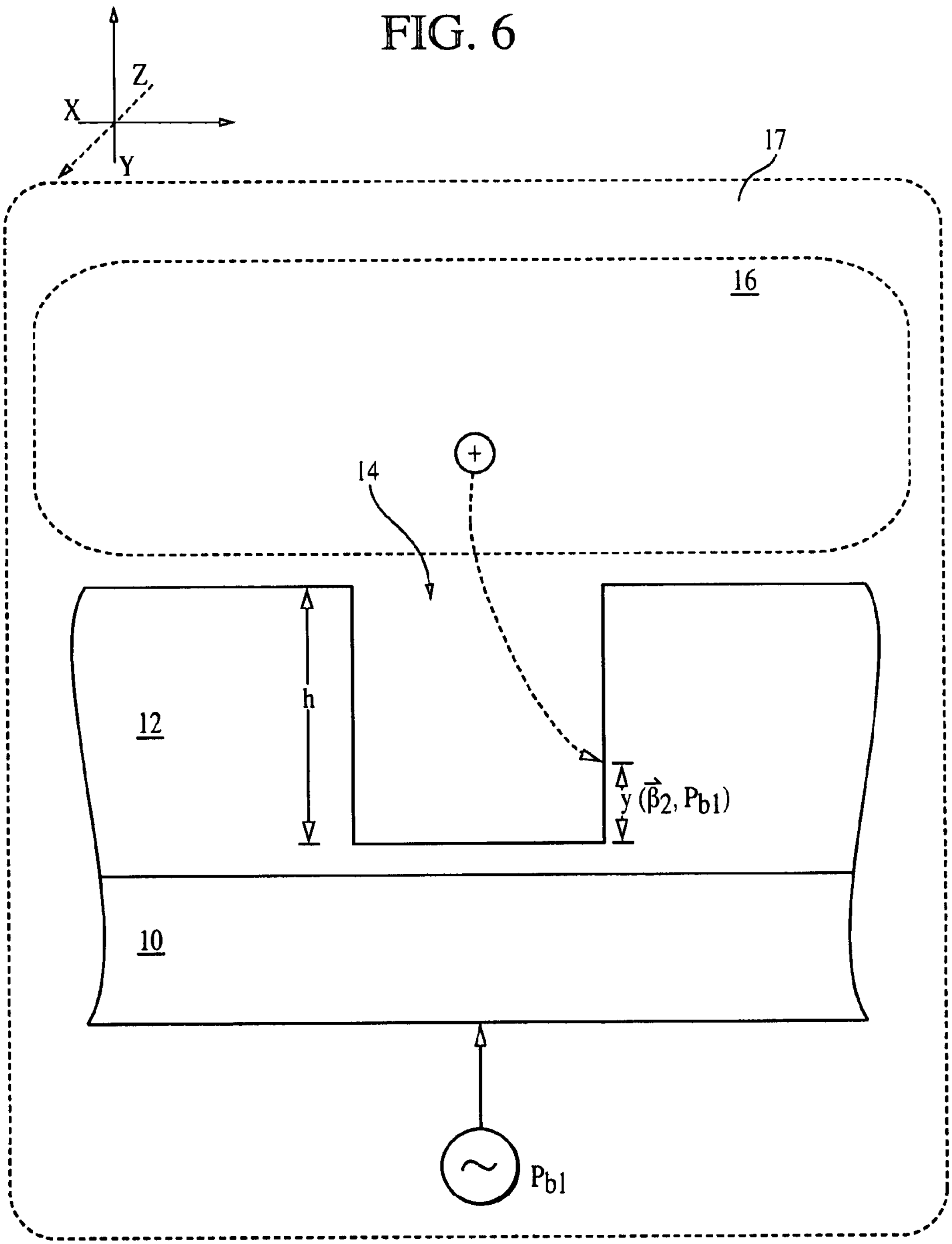

The first order parameters to control for the technique of the invention are bulk plasma stability, the magnetic field direction ($\vec{\beta}/|\vec{\beta}|$) and intensity ($\vec{\beta}$), and RF bias power ($P_b$). Once a stable plasma environment is achieved, the magnetic field direction ($\vec{\beta}/|\vec{\beta}|$), the magnetic field intensity M), and the RF bias power ($P_b$) can be adjusted to variably control the etching of the workpiece, where parameter variabilities include: field intensity $|\vec{\beta}|$>field intensity $|\vec{\beta}|$ and RF bias power $P_{b1}$>RF bias power $P_{b2}$. FIG. 4 shows that by using $\vec{\beta}$, $P_{b1}$ parameters for the magnetic field and bias power, plasma etching can be achieved at a desired relative height "y" within the trench 14 of depth "h." FIG. 4 can be compared to FIG. 5, which shows that by adjusting to the $\vec{\beta}_1$, $P_{b2}$ parameters, the desired relative height "y" can be increased as the ion is steered more severely. FIG. 4 and FIG. 5 can be compared to FIG. 6, which shows that by adjusting to the $\vec{\beta}_2$, $P_{b1}$ parameters, the desired relative height "y" can be decreased because the ion is steered less severely. By controlling the magnetic field intensity and RF bias power parameters along with the direction of the magnetic field, one can control where the workpiece is etched with greater precision than was previously available in the art so that novel microstructures can be formed.

Figure 7:
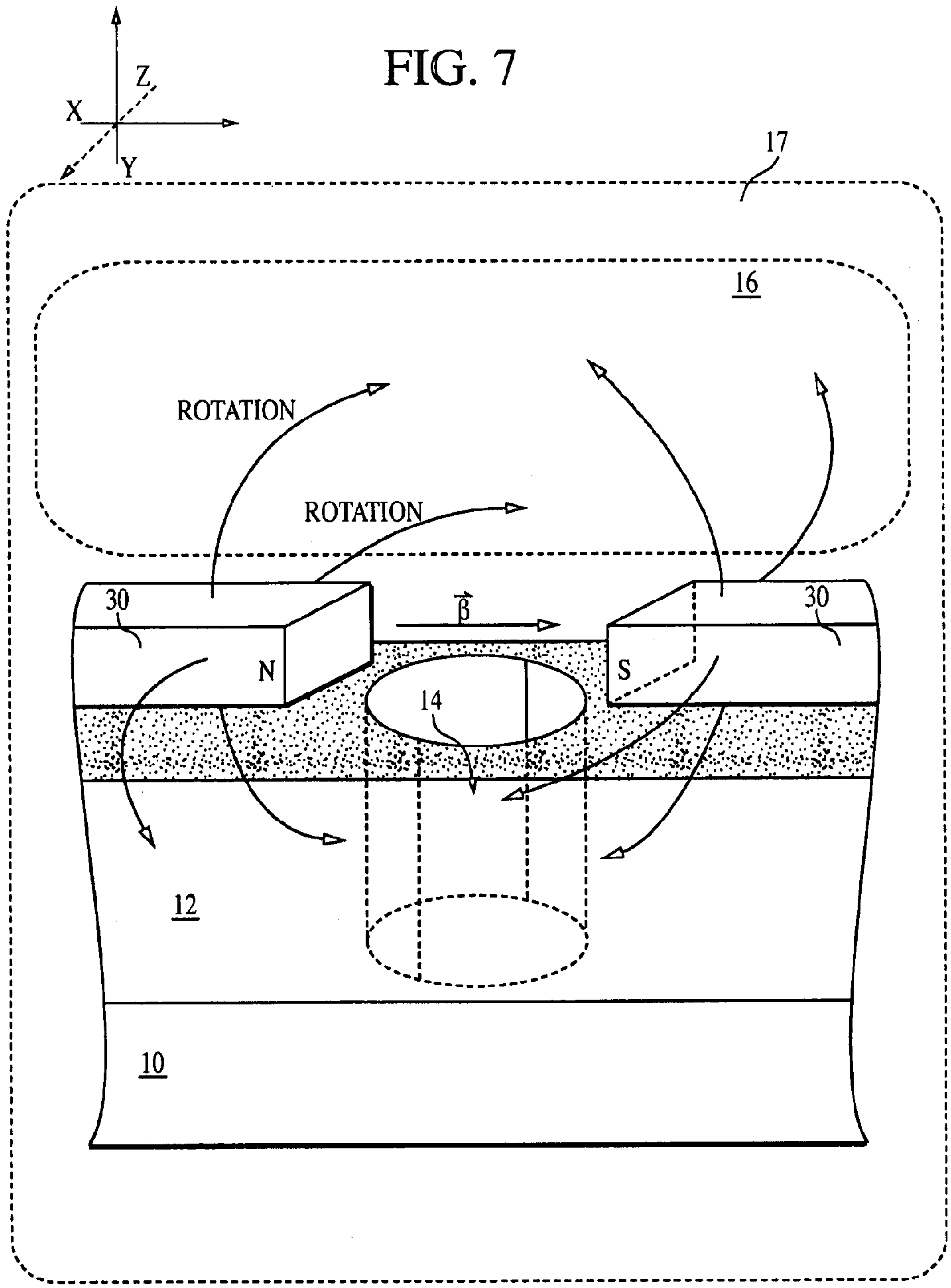
FIG. 7 is an illustration of the generation and control of the magnetic field with rotatable magnets in accordance with one embodiment the invention.
Figure 8:
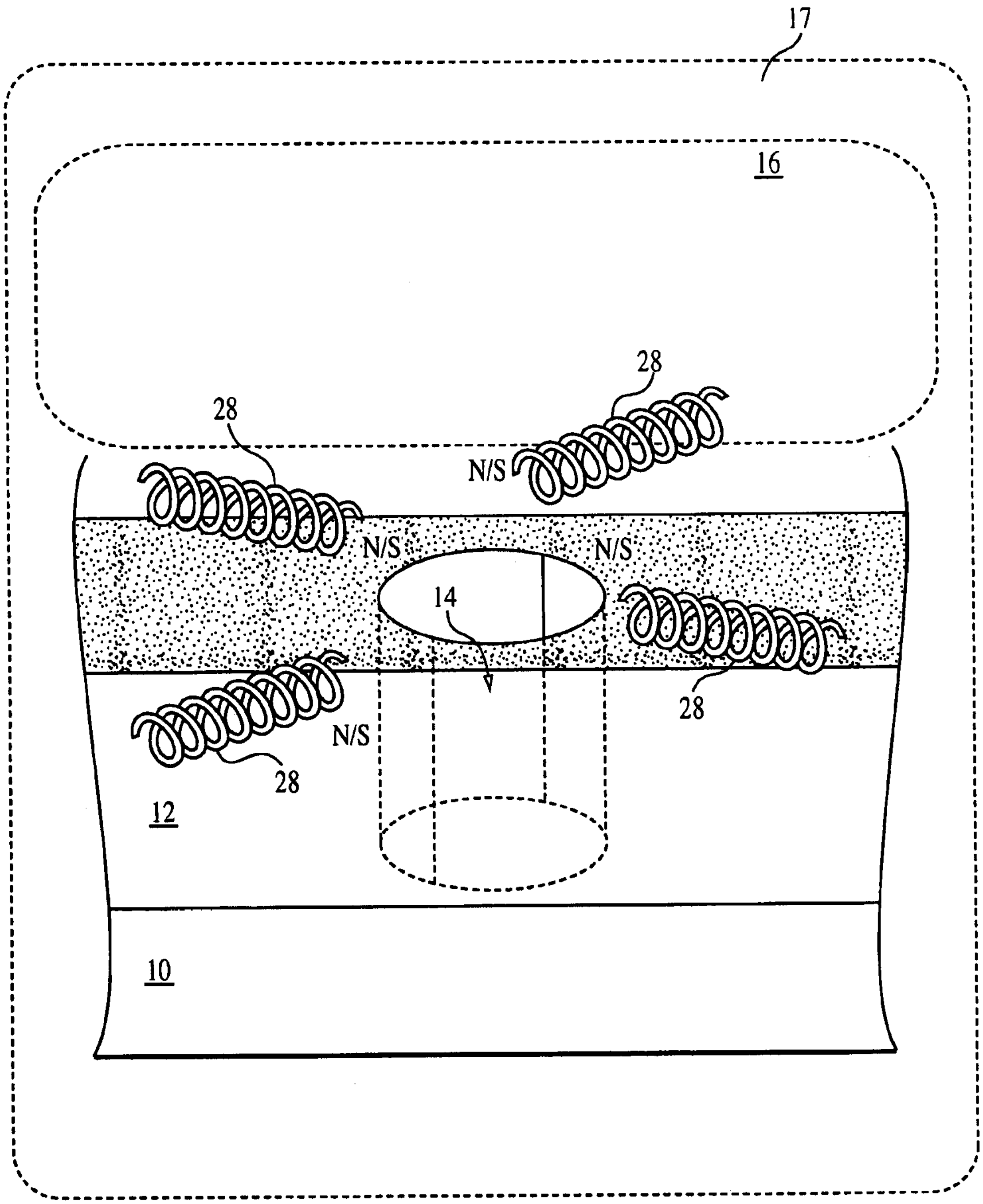
FIG. 8 is an illustration of the generation and control of the magnetic field with controlled electric coils in accordance with one embodiment of the invention.

Now referring to FIGS. 7 and 8, as discussed above, there are various ways to generate the magnetic field in accordance with the invention. Two such ways are with permanent magnets 30 and electromagnetically with electric coils 28. As shown in FIG. 7, permanent magnets 30 can be positioned around the workpiece and can be moved physically in relation to the workpiece's trench 14, hole, or other feature, to change the magnetic field direction. This can be accomplished by either rotating the magnets 30 or the workpiece around one or more axes "X," "Y," or "Z," or by moving the magnetic field along one or more of these axes. As shown in FIG. 8, in the case of electromagnetically generated fields, the field direction can be changed by activating different physically located coils 28 as a function of time. The magnetic field sources can be placed internally or externally of the vacuum side of the processing chamber, and they can be situated locally or remotely to the workpiece.

Figure 10:
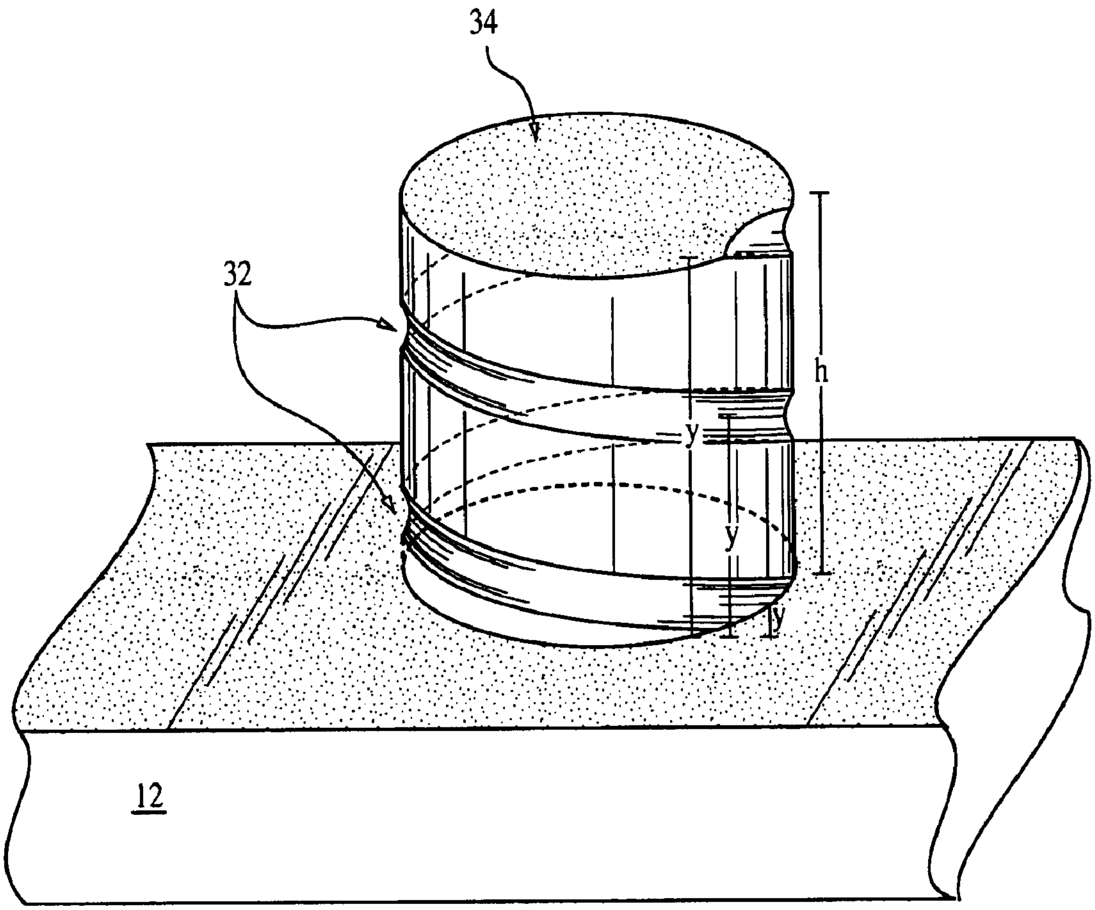

In accordance with the above described embodiments of the invention it is possible to form microstructures like those shown in FIGS. 9 and 10. FIG. 9 shows a circular trench 14 where a helical "thread" has been etched from the wall of the trench 14. Such a microstructure can be formed by utilizing a trench 14 as described above. The interior wall of the trench 14 can be etched from the top down at decreasing heights "y," or from the bottom up at increasing heights "y," in a rotating pattern by rotating the magnetic field with respect to the workpiece, to form a helical coil etched region 32. The result will be an etched region 32 resembling a coil structure traveling the depth "h" of the trench 14 interior wall.

FIG. 10 shows a circular pillar 34 formed from the substrate 12. The pillar 34 is in relief above the surrounding surface of the substrate 12. The exterior wall of the pillar 34 can be etched in much the same fashion as the interior wall of the trench 14 described in relation to FIG. 9. Again, a helical coil can be etched to form an etched region 32 resembling a coil structure traveling the height "h" of the pillar 34.

Either of the structures from FIG. 9 or 10 can be formed by controlling the magnetic field intensity and direction along with the RF bias power. For example, once the hole/trench 14 structure has been formed as shown in FIG. 9, a stable plasma 16 can be generated. Then, a weak magnetic field is generated as described above. The intensity ($\vec{\beta}$) of the magnetic field can be set to a constant level, if the trench 14 can remain subject to the same magnetic field parameters throughout any rotation of the workpiece relative to the field during the etching process. Otherwise, the intensity ($\vec{\beta}$) should be adjusted to compensate for changes caused by such rotation. The workpiece and the magnetic field source (magnets 30 or coils 28) are rotated relative to one another so that the magnetic field's direction ($\vec{\beta}/|\vec{\beta}|$) is adjusted to rotate relative to the trench 14 (in the case of FIG. 9, around the "Y" axis). The rotation must be timed relatively to the adjustments to the RF bias power ($P_b$) so that the desired distance between etched regions 32 is achieved. During rotation of the magnetic field direction ($\vec{\beta}/|\vec{\beta}|$) relative to the trench 14, the RF bias power ($P_b$) can either be increased from a relatively low RF bias power (e.g., $P_{b2}$) to a higher RF bias power (e.g., $P_{b1}$), or vice versa, so that the etched region 32 shifts in height "Y" as desired. Alternatively, the magnetic field intensity can also be varied during this rotation. In these ways, various etched regions 32 can be created, from a single etched band spanning any portion of the trench 14, to an etched helical coil as shown in FIG. 9 having any frequency of coiling as desired. A very similar technique can be used to create the structure shown in FIG. 10.

The rotation of the magnetic field direction ($\vec{\beta}/|\vec{\beta}|$) described above can be in increments with a constant stable plasma 16. Alternatively, the stable plasma 16 can be intermittently generated with incremental magnetic field rotation. Or, alternatively, the magnetic field can be constantly rotated in the presence of a stable plasma 16. These techniques are exemplary and other techniques can be utilized as well.

Figure 11:
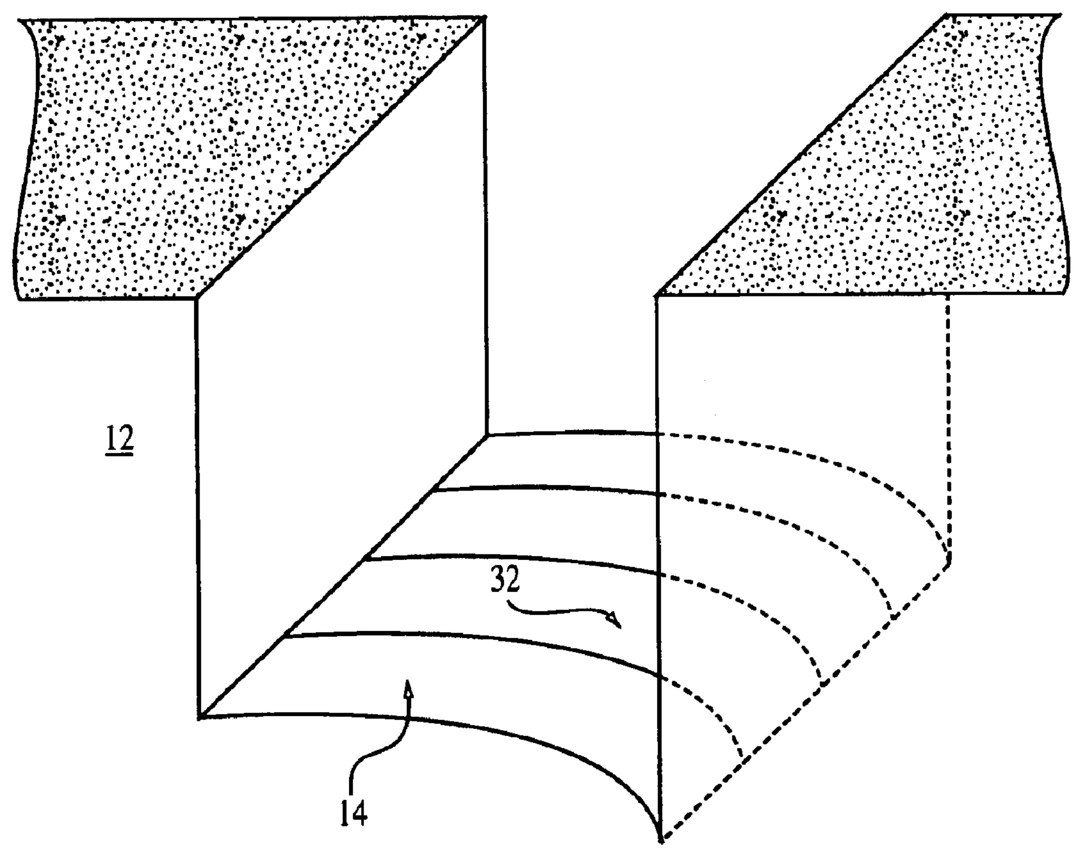
FIGS. 11–13 are illustrations of various trenches formed in accordance with embodiments of the invention.
Figure 12A:
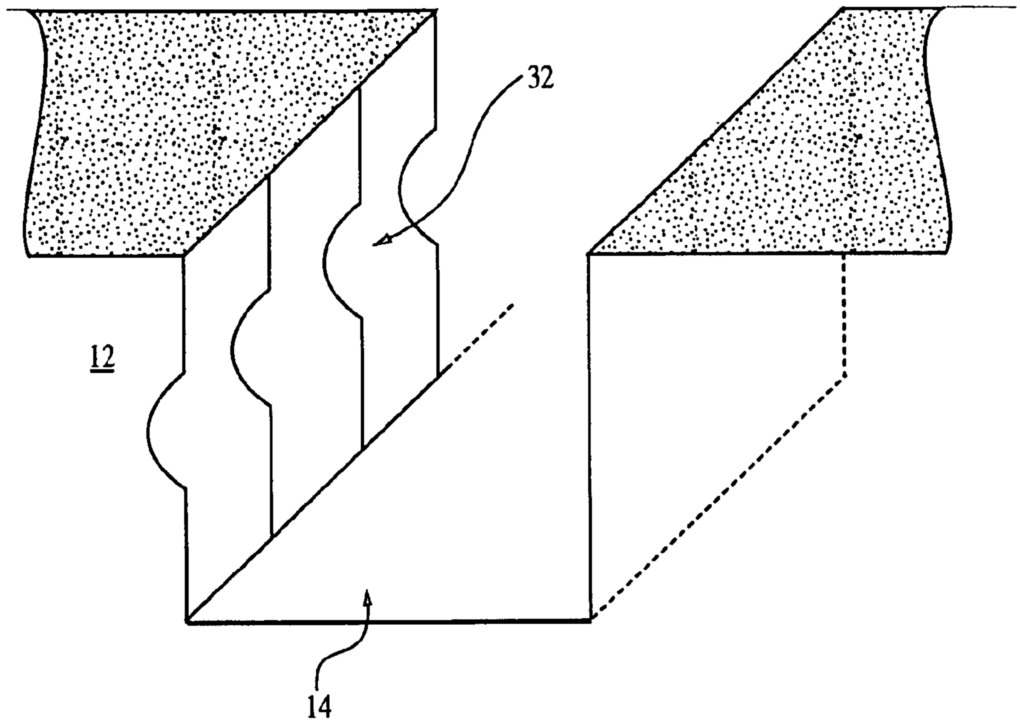
Figure 12B:
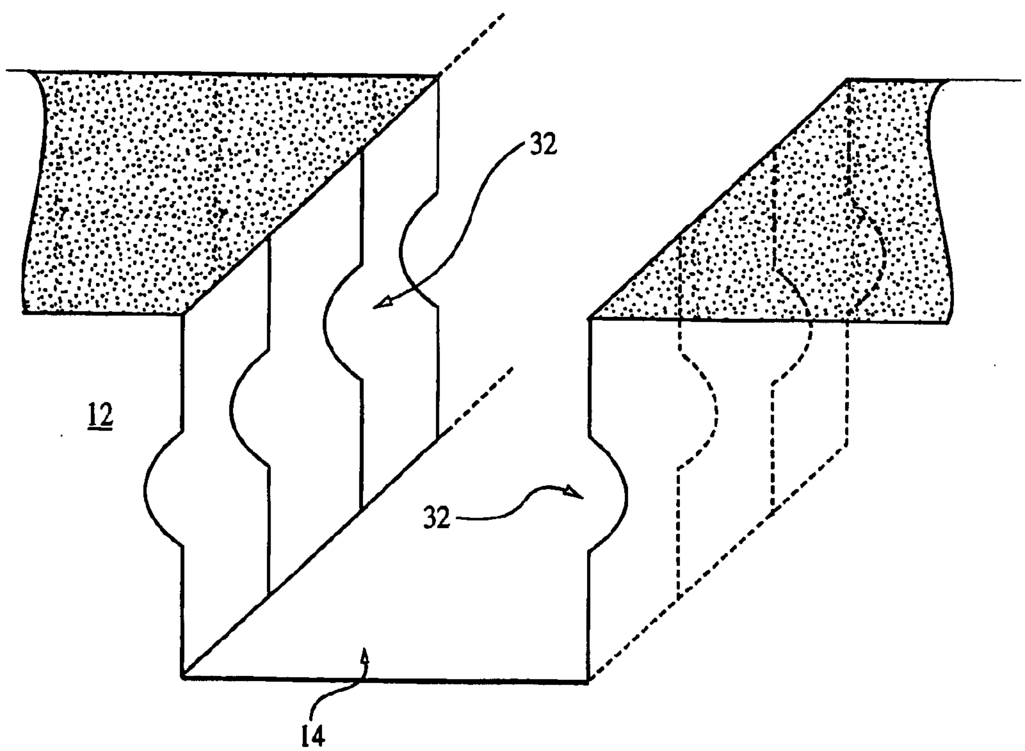
Figure 13:
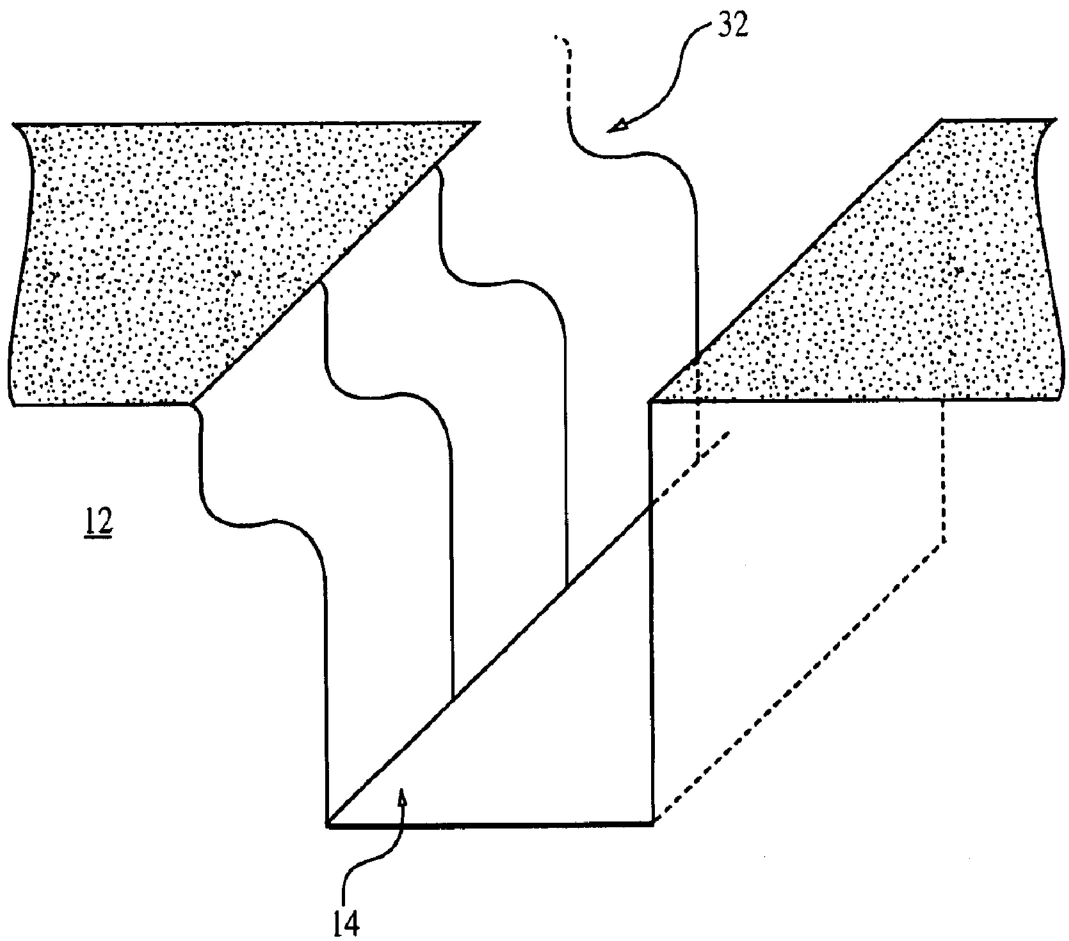

Like the etched regions 32 described in relation to FIG. 9 and 10, various trench 14 designs can be created in accordance with the invention as illustrated by the embodiments shown in FIGS. 11–13. FIG. 11 shows a trench 14 having an etched region 32 that contours the bottom of the trench 14 more severely on one side. FIG. 12A shows a trench 14 with an etched region 32 forming a reentrant region in the trench 14 wall. FIG. 12B shows the same general design as in FIG. 12A with reentrant etched regions 32 in two trench walls. FIG. 13 shows a trench 14 with an etched region 32 forming a "shelf" structure in one trench wall. Each etched region 32 shown in FIGS. 11–13 can be formed as described above by controlling the bias power ($P_b$) and magnetic field intensity and direction parameters ($\vec{\beta}$) and ($\vec{\beta}/|\vec{\beta}|$) as described herein. Other microstructures can be formed in accordance with this invention. Microstructures like those of FIGS. 11–13, and other microstructures formed by the invention's process can be incorporated into an MEMS.

Figure 14:
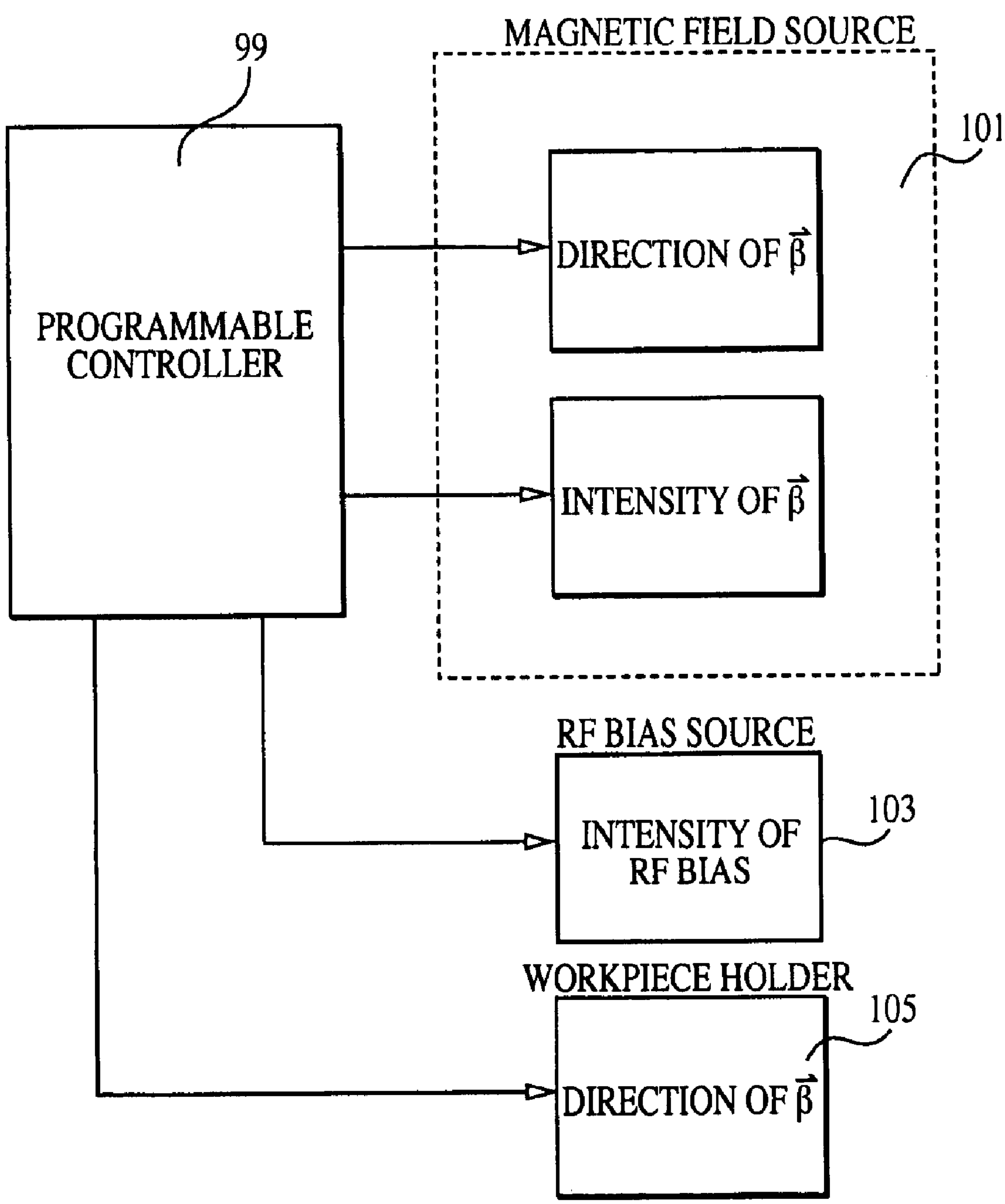
FIG. 14 illustrates a control system for controlling a plasma reactor in accordance with the invention.

FIG. 14 illustrates a programmable controller 99 which can be used with a magnetic field source 101, RF bias source 103 and a workpiece holder 105 to carry out etching operations in accordance with the invention. The programmable controller can be any type of controller including a microprocessor, programmable gate array, or other programmable device. Controller 99 is programmed with a series of instructions for carrying out an etching operation and is capable of controlling the direction of the applied magnetic field during an etching operation by controlling the magnetic field source 101 and/or the workpiece holder to change the direction of the magnetic field relative to a workpiece on the holder. Controller 99 is also capable of controlling the intensity of the applied magnetic field during etching by controlling the distance of a magnetic field relative to a workpiece on the holder. Controller 99 is also capable of controlling the intensity of the applied magnetic field by controlling the magnetic intensity emitted by magnetic source 101 and is further capable of controlling the RF bias power during an etching operation by controlling the RF bias source 103. Accordingly, a desired complex etching operation can be performed by suitably programming the controller 99.

The above description and accompanying drawings are only illustrative of exemplary embodiments, which can achieve the features and advantages of the invention. It is not intended that the invention be limited to the embodiments shown and described above. The invention can be modified to incorporate any number of variations, alterations, substitutions, or equivalent arrangements not heretofore described, but which are commensurate with the spirit and scope of the invention. The invention is only limited by the scope of the following claims.

What is claimed as new and desired to be protected by Letters Patent of the United States is:

1. A method of forming a microstructure by micromachining, comprising:

providing a substrate in a processing chamber, said substrate comprising an etchable material and having at least one contoured feature;

generating a stable ion-containing etching plasma in said processing chamber, said plasma etching the contoured feature of said substrate;

generating a magnetic field, said magnetic field being adjustable in intensity and direction;

applying an RF bias power to said substrate, said RF bias power being adjustable in intensity; and controlling said etching of the contoured feature by creating an electron differential at said contoured feature by adjusting at least one of said magnetic field intensity, magnetic field direction, and RF bias power intensity during said etching, thereby forming a second contoured feature at said contoured feature.

2. The method of claim 1, further comprising adjusting at least said magnetic field intensity and said magnetic field direction during said etching.

3. The method of claim 1, further comprising adjusting at least said magnetic field intensity and said RF biasing power during said etching.

4. The method of claim 1, further comprising adjusting at least said magnetic field direction and said RF biasing power during said etching.

5. The method of claim 1, further comprising adjusting at least two of the magnetic field intensity, the magnetic field direction, and the RF biasing power simultaneously.

6. The method of claim 1, further comprising adjusting the magnetic field intensity, the magnetic field direction, and the RF biasing power simultaneously.

7. The method of claim 1, wherein said plasma comprises free electrons and ions, said method further comprising adjusting at least one of said magnetic field intensity and direction to effect the path of travel of said free electrons whereby a plurality of said electrons form a high negative charge density region on said substrate; and adjusting said RF biasing power to effect the velocity of said ions toward said substrate, wherein said velocity of said ions is also effected by said high negative charge density region.

8. The method of claim 1, further comprising adjusting at least two of said magnetic field intensity, said magnetic field direction, and said RF bias power, as a function of time.

9. The method of claim 8, further comprising adjusting said magnetic field intensity and said magnetic field direction.

10. The method of claim 8, further comprising adjusting said magnetic field intensity and said RF bias power.

11. The method of claim 8, further comprising adjusting said magnetic field direction and said RF bias power.

12. The method of claim 1, wherein said etchable material comprises silicon oxide.

13. The method of claim 1, wherein said etchable material comprises silicon nitride.

14. The method of claim 1, wherein said at least one contoured feature of said substrate comprises at least one depressed area within said substrate.

15. The method of claim 14, wherein said depressed area comprises a trench.

16. The method of claim 14, wherein said depressed area comprises a hole.

17. The method of claim 1, wherein said at least one contoured feature of said substrate comprises at least one substrate protrusion.

18. The method of claim 17, wherein said at least one protrusion comprises a pillar.

19. The method of claim 1, further comprising generating said plasma from a noble gas.

20. The method of claim 1, further comprising generating said plasma from a fluorocarbon gas.

21. The method of claim 1, further comprising generating said plasma from an oxygen gas.

22. The method of claim 1, further comprising generating said plasma from a carbon chloride gas.

23. The method of claim 1, wherein said magnetic field is strong enough to effect the path of travel of free electrons, but too weak to effect the path of ions of said plasma.

24. The method of claim 1, further comprising generating said magnetic field with permanent magnets.

25. The method of claim 1, further comprising generating said magnetic field with electric coils.

26. The method of claim 1, further comprising applying an RF (bias power in a range between about 0 watts and about 5000 watts.

27. The method of claim 1, further comprising biasing said substrate with an inductive power in a range between about 300 watts and about 10,000 watts.

28. A method of forming a fabricated device, comprising:

providing a contoured workpiece;

generating a stable plasma, said plasma comprising free electrons and ions, said free electrons having a velocity toward said workpiece;

generating a magnetic field at said workpiece and within said plasma;

forming a high negative charge density region on a contoured region of said workpiece by effecting the path of travel of said free electrons with said magnetic field, thereby forming a contoured feature at said contoured region; and changing the location of said high negative charge density region by changing a direction of said magnetic field while etching said workpiece with said plasma.

29. The method of claim 28, further comprising applying an RF bias power to said substrate during said etching.

30. The method of claim 28, wherein said magnetic field is strong enough to effect the path of travel of said free electrons, but not strong enough to effect the path of said ions.

31. The method of claim 28, further comprising controlling said magnetic field in at least one of its intensity and direction relative to said workpiece, during said etching to alter the path of travel of said free electrons.

32. The method of claim 29, further comprising adjusting the RF bias power to effect the velocity of said ions toward said workpiece during said etching.

33. The method of claim 28, further comprising adjusting said magnetic field in intensity and said magnetic field direction during said etching.

34. The method of claim 29, further comprising adjusting said magnetic field in intensity and said RF bias power during said etching.

35. The method of claim 29, further comprising adjusting said magnetic field direction and said RF bias power during said etching.

36. The method of claim 29, further comprising adjusting at least one of said magnetic field in intensity and direction, with said RF bias power, relative to each other and as a function of time during said etching.

37. The method of claim 34, further comprising adjusting said magnetic field intensity and said RF bias power simultaneously during said etching.

38. The method of claim 35, further comprising adjusting said magnetic field direction and said RF bias power simultaneously during said etching.

39. The method of claim 28, further comprising rotating one of said workpiece and said magnetic field relative to the other.

40. The method of claim 28, wherein said workpiece comprises a layer of an insulating material with a contoured region which is etched by said plasma.

41. The method of claim 40, wherein said fabricated device is formed in said layer of insulating material.

42. The method of claim 41, wherein said insulating material comprises silicon oxide.

43. The method of claim 41, wherein said insulating material comprises silicon nitride.

44. The method of claim 28, wherein said contoured region of said workpiece comprises at least one depressed area within said workpiece.

45. The method of claim 44, wherein said depressed area comprises a trench.

46. The method of claim 44, wherein said depressed area comprises a hole.

47. The method of claim 28, wherein said contoured region of said workpiece comprises at least one workpiece protrusion.

48. The method of claim 47, wherein said workpiece protrusion comprises a pillar.

49. The method of claim 28, further comprising generating said magnetic field with permanent magnets.

50. The method of claim 28, further comprising generating said (magnetic field with at least one electric coil.

51. The method of claim 29, further comprising applying said RF bias power to said workpiece in a range between about 0 and about 500 watts.

52. The method of claim 29, further comprising applying an inductive power to said substrate in a range between about 300 and about 10,000 watts.

53. A method of plasma etching a material layer to form a microstructure, comprising:

providing a material layer having at least one contour;

flowing gas into a chamber containing said material layer;

generating a stable etching plasma from said gas, wherein said plasma comprises free electrons and ions generating a magnetic field, said magnetic field being adjustable in intensity and direction;

asymmetrically etching said material layer at said at least one contour with said plasma to form a second contour at said at least one contour; and varying the location of said etching during said etching by varying a location of impingement of said free electrons on said material layer.

54. The method of claim 53, further comprising varying said location by generating a magnetic field within said chamber and varying the direction of said magnetic field.

55. The method of claim 53, wherein said material layer comprises a silicon oxide layer.

56. The method of claim 53, wherein said material layer comprises a silicon nitride layer.

57. The method of claim 53, wherein said at least one contour comprises at least one depressed area with said material area.

58. The method of claim 57, wherein said depressed area comprises a trench.

59. The method of claim 57, wherein said depressed area comprises a hole.

60. The method of claim 53, wherein said at least one contour comprises at least one protrusion.

61. The method of claim 60, wherein said protrusion is a pillar.

62. The method of claim 53, further comprising generating said plasma from a gas selected from the group consisting of noble gases, fluorocarbons, oxygen, carbon chlorides, or mixtures thereof.

63. The method of claim 54, further comprising generating said magnetic field to be strong enough to influence the velocity of said free electrons, but weak enough not to influence the path of said ions.

64. The method of claim 63, further comprising generating said magnetic field by permanent magnets.

65. The method of claim 63, further comprising generating said magnetic field by at least one electric coil.

66. A method of forming a plasma etched device, comprising:

providing a contoured workpiece comprising an insulating material in a plasma chamber;

generating a stable plasma within said chamber from a gas flow, said plasma comprising free electrons and ions, said free electrons having a path of travel toward said workpiece, said ions etching said workpiece, thereby forming a contoured feature at a contour of said workpiece;

generating a magnetic field at said workpiece and controlling said magnetic field in intensity and direction to vary a location of impingement of said free electrons on said workpiece, said location of impingement of said ions on said workpiece being effected by the location of impingement of free electrons on said workpiece; and applying an RF bias power to said workpiece during ion etching and adjusting said RF bias power during etching to vary the intensity of etching.

* * * * *

UNITED STATES PATENT AND TRADEMARK OFFICE

CERTIFICATE OF CORRECTION

PATENT NO. : 7,033,514 B2
APPLICATION NO. : 09/938644
DATED : April 25, 2006
INVENTOR(S) : Neal Rueger It is certified that error appears in the above-identified patent and that said Letters Patent is hereby corrected as shown below:

In the Specification, the following errors are corrected:

Column 1, line 17, “know” should read --known--;

Column 1, line 25, “modem” should read --modern--;

Column 2, line 25, “embodiment the” should read --embodiment of the--;

Column 4, line 57, “(|E|)” should read --(E/|E|)--;

Column 4, line 67, “M” should read -- $(\vec{\beta})$ --; and

Column 5, line 4, “ $\vec{\beta}$, $P_{b1}$” should read -- $\vec{\beta}_1$, $P_{b1}$--.

In Claim 54, Col. 10 Line 9, the following error is corrected:

“The method of claim 53, further comprising varying said location by generating a magnetic field within said chamber and varying the direction of said magnetic field”.

Should read

--The method of claim 53, further comprising varying said location by varying the direction of said magnetic field.--.

Signed and Sealed this

Thirtieth Day of December, 2008

JON W. DUDAS
*Director of the United States Patent and Trademark Office*